(12) United States Patent
Pahl et al.

(10) Patent No.: US 8,674,464 B2
(45) Date of Patent: Mar. 18, 2014

(54) MEMS COMPONENT, METHOD FOR PRODUCING A MEMS COMPONENT, AND METHOD FOR HANDLING A MEMS COMPONENT

(75) Inventors: Wolfgang Pahl, Munich (DE); Gregor Feiertag, Munich (DE); Anton Leidl, Hohenbrunn (DE)

(73) Assignee: Epcos AG, Munich (DE)

( * ) Notice: Subject to any disclaimer, the term of this patent is extended or adjusted under 35 U.S.C. 154(b) by 108 days.

(21) Appl. No.: 12/842,677

(22) Filed: Jul. 23, 2010

(65) Prior Publication Data

US 2011/0018076 A1    Jan. 27, 2011

Related U.S. Application Data

(63) Continuation of application No. PCT/DE2009/000073, filed on Jan. 21, 2009.

(30) Foreign Application Priority Data

Jan. 23, 2008   (DE) .................... 10 2008 005 686

(51) Int. Cl.
*H01L 21/00* (2006.01)
*G01L 9/00* (2006.01)

(52) U.S. Cl.
USPC ............... 257/419; 257/E29.324; 438/53

(58) Field of Classification Search
USPC .................. 257/419, E29.324; 438/53
See application file for complete search history.

(56) References Cited

U.S. PATENT DOCUMENTS

| 7,373,835 | B2 * | 5/2008 | Matsubara ............... 73/756 |
|---|---|---|---|
| 7,476,567 | B2 | 1/2009 | Sato |
| 2002/0194919 | A1 * | 12/2002 | Lee et al. ............... 73/718 |
| 2003/0189242 | A1 | 10/2003 | Ma et al. |
| 2004/0051181 | A1 | 3/2004 | Ma et al. |
| 2004/0157367 | A1 * | 8/2004 | Wong et al. ............ 438/106 |
| 2005/0093087 | A1 | 5/2005 | Kadel et al. |
| 2005/0249041 | A1 * | 11/2005 | Pedersen ............... 367/179 |
| 2006/0115102 | A1 * | 6/2006 | Mullenborn et al. ...... 381/174 |
| 2006/0125577 | A1 * | 6/2006 | Hsieh et al. ............ 333/191 |
| 2006/0137456 | A1 * | 6/2006 | Dasgupta et al. ........ 73/705 |
| 2006/0213275 | A1 * | 9/2006 | Cobianu et al. ......... 73/754 |
| 2008/0014720 | A1 * | 1/2008 | Tyler .................. 438/462 |
| 2008/0081398 | A1 * | 4/2008 | Lee et al. ............. 438/109 |
| 2009/0001553 | A1 * | 1/2009 | Pahl et al. ............ 257/704 |
| 2009/0081828 | A1 * | 3/2009 | Freidhoff et al. ........ 438/113 |
| 2009/0232336 | A1 | 9/2009 | Pahl |

FOREIGN PATENT DOCUMENTS

| DE | 42 23 215 A1 | 1/1994 |
|---|---|---|
| DE | 103 44 229 A1 | 5/2005 |
| DE | 10 2006 022 379 A1 | 11/2007 |
| DE | 10 2006 046 292 A1 | 4/2008 |
| JP | 11-251493 A | 9/1999 |
| JP | 2004-017171 A | 1/2004 |
| JP | 2005-324320 A | 11/2005 |
| JP | 2006-173557 A | 6/2006 |
| WO | WO 00/74932 A1 | 12/2000 |
| WO | WO 2007054070 A1 * | 5/2007 ......... B81B 7/00 |

\* cited by examiner

*Primary Examiner* — Steven J Fulk
(74) *Attorney, Agent, or Firm* — Slater & Matsil, L.L.P.

(57) ABSTRACT

A MEMS component includes a substrate in which at least one cavity is present. The cavity is closed off toward an active side of the substrate. An inactive side is arranged opposite the active side of the substrate, and the substrate is covered with a covering film on the inactive side.

35 Claims, 5 Drawing Sheets

MEMS COMPONENT, METHOD FOR PRODUCING A MEMS COMPONENT, AND METHOD FOR HANDLING A MEMS COMPONENT

This application is a continuation of co-pending International Application No. PCT/DE2009/000073, filed Jan. 21, 2009, which designated the United States and was not published in English, and which claims priority to German Application No. 10 2008 005 686.3, filed Jan. 23, 2008, both of which applications are incorporated herein by reference.

BACKGROUND

Mobile communication devices are a source of huge miniaturization pressure on electronic components. This especially concerns MEMS components (Micro-Electro-Mechanical System) such as microphones, for example, which have a relatively high structural form, with the consequence of restrictions for the device design particularly of mobile communication devices.

A wide variety of microelectronic components such as individual semiconductors, memories, processors, SAW components (Surface acoustic wave), BAW components (Bulk acoustic wave), and others, are fabricated at the wafer level. In this case, processes such as layer deposition, photolithography methods, printing methods and others are carried out in parallel for a multiplicity of components. In this case, a multiplicity of chips of identical type arise on a wafer. For encapsulating the components, external packages are often used.

Specifically for semiconductor components, usually on the basis of silicon wafers, numerous concepts have already been developed for a so-called WLP (wafer level packaging). In this method, the encapsulation is realized at the wafer level in a surface process. The majority of the WLP concepts known for semiconductor components are based on bump connections consisting of solder that is applied on the wafer by vapor deposition, printing or electrodeposition. A further wafer, as covering, is placed onto the bump connections. For this purpose, on account of the good thermomechanical matching, the same material is preferably used, such as, e.g., a further silicon wafer. It is also known to emplace a second wafer directly and to produce the electrical connection through the second wafer by means of through-plating through the first or second wafer.

However, a further wafer composed of silicon is costly and the required alignment and connection methods are likewise complicated and expensive. Moreover, during singulation, a larger material thickness has to be severed and, depending on the connection method, an additional material such as adhesive, solder, glass frit, etc., is also needed. This makes processing more difficult. Furthermore, the component has a significantly higher structural form.

Since, in many cases, still further packaging is effected anyway in addition to this primary encapsulation, such a WLP often constitutes an exaggerated outlay for achieving the aims.

SUMMARY

In one aspect, the disclosure provides an efficient, miniaturized and cost-effective solution for MEMS components which avoids the disadvantages mentioned.

A MEMS component (Micro-Electro-Mechanical System) is specified, comprising a substrate, in which at least one cavity is present. The substrate has an active side and an inactive side. The cavity is closed off toward the active side. The cavity is preferably closed off by means of a membrane. The active and inactive sides are situated on opposite sides of the substrate. A covering film is applied on the inactive side of the substrate, which covering film covers the substrate and thus closes off the cavity preferably toward the outside.

The MEMS components are thereby protected against damage or destruction during processing, and in particular during sawing. Furthermore, a MEMS component of this type makes it possible to use specific packaging processes which would otherwise lead to damage to the component or to an impairment of the component function. Partial volumes can also be delimited by the covering film.

In one preferred embodiment, the covering film is applied by means of an adhesive on the substrate.

In one embodiment, an adhesive film is applied between the substrate and the covering film, the adhesive film fixing the covering film on the substrate. In one preferred embodiment, the adhesive covers the covering film virtually over the whole area.

However, it is also possible for the adhesive preferably to be arranged at the locations at which the covering film is in contact with the substrate. Consequently, those regions of the covering film which cover a cavity are as free of adhesive as possible.

It is advantageous to carry out the adhesive bonding using an adhesive whose adhesive effect is activated only upon application or lamination. This can be effected by means of pressure and/or heat, for example. Hot melt adhesives or so-called "B-stage" materials are particularly suitable for this purpose.

The covering film preferably consists of a polymer film. However, it is also possible to use a metal film.

In one preferred embodiment, the covering film is a polyimide film. Polyimide films have the advantage that, on the macroscopic scale, they are highly flexible and can therefore be processed in a simple manner but, on the microscopic scale, they are rigid enough to withstand the relevant pressure differences both during production and during operation of the MEMS component without relatively large deformations.

The covering film spans the cavities preferably in a flat horizontal form. However, it is also possible, by virtue of different compliance of the laminating tool used, such as a rolling or pressure plate, for example, to deform the covering concavely or convexly relative to the surface of the substrate in the region of the cavity. It is also possible by means of lamination or after-treatment in an autoclave, through the choice of suitable pressure, temperature or time profiles, to set a concave or else convex form which is fixed after subsequent full curing of the material.

In a further embodiment, further functional elements can be arranged on the covering film or in the region of the cavity. The functional elements can be a simple covering or alternatively active or passive components.

Preferably, the MEMS component is embodied as a pressure sensor. In a further embodiment, however, the MEMS component can also be embodied as a microphone or have any further function desired.

In order to produce the MEMS component, firstly a plurality of cavities are produced on a substrate wafer. The cavities are preferably closed off toward a first active side. The cavities are closed off on the active side preferably by means of a membrane. The cavities preferably have an opening toward an inactive side. In a second step, a covering film is applied to the inactive side of the substrate wafer, wherein the covering is adhesively bonded to the substrate wafer in the regions of the substrate wafer which do not form a cavity.

In one preferred method step, the covering film is applied over the whole area on the inactive side of the substrate wafer.

In one preferred method step, the covering is applied in the form of a polymer film. In an alternative method step, the covering can also be applied as a metal film.

In a further method step, the substrate wafer is adhesively bonded onto a provided carrier film preferably by the active side. The carrier film serves for temporarily fixing the individual components present after the singulation of the substrate wafer on the carrier film. So-called "UV release tapes" are particularly suitable for this purpose. The latter have a high adhesive strength and can easily be stripped away after a UV treatment.

In a further method step, the covering film is severed along the lines of a singulation pattern as far as the substrate wafer. The severing can be effected by means of laser ablation. However, the severing of the separation can also be effected by means of a sawing method.

As an alternative, a photolithographically processed film can be applied by lamination, which is structured by means of scanning exposure or mask exposure and subsequent development in a corresponding manner.

In a further method step, the substrate wafer is divided into individual MEMS components in accordance with the singulation pattern preferably by means of a sawing method.

As an alternative, the substrate wafer can also be singulated by means of laser cutting. Incipient scribing of the substrate wafer with subsequent controlled breaking can be used as a further possibility for singulating the components.

However, it is also possible to singulate the substrate wafer by means of energy input into a focal plane below the substrate surface. Through a suitable choice of laser wavelength, focus diameter, power, pulse frequency and scanning parameters, an attack on the substrate can be avoided. Particularly when a laser is used for singulating the substrate wafer, uncovering the substrate surface in the region of the separating line by means of laser ablation or by means of a sawing method is advantageous. As a result, the covering film can be drawn back in the region of the outer edges of the MEMS component.

In the case where the substrate wafer is divided by means of a sawing method, the preparation of the substrate along the sawing lines can be obviated. The cavity with sensitive MEMS structures is optimally protected between the covering film, firstly, and the carrier film. If permitted by the MEMS structures, however, it is also possible to effect sawing from the active side of the substrate.

For positioning a MEMS component on a mounting substrate, the MEMS component is gripped and positioned on a mounting substrate. In this case, vacuum tools are preferably used, which could damage the sensitive MEMS structures in the case of a MEMS component without a covering film above the cavity, this being avoided by means of the covering film. The positioning with the active side of the MEMS component in the direction of the mounting substrate is performed such that at least the region below the cavity is free of mechanical contact with the mounting substrate.

The method step of gripping and positioning the MEMS component is preferably effected by means of a vacuum gripper.

For fixing and making contact with the MEMS component on the mounting substrate, so-called bumps are preferably used, which are arranged between a mounting substrate and MEMS component. The mounting substrate preferably has an opening in the region of the cavity of the substrate wafer.

However, it is also possible for the MEMS component to be fixed by means of adhesive bonding between the mounting substrate and the inactive side of the MEMS component. In this case, the inactive side of the MEMS component is fixed on the mounting substrate by means of an adhesive layer. Since a covering film is situated on the inactive side of the MEMS component, the covering film prevents the adhesive material of the adhesive layer from being able to pass into the interior of the cavity.

The mounting substrate used can be a cavity package, for example, which preferably consists of a ceramic material. Cavity packages can be produced with very small dimensions, wall thicknesses and dimensional tolerances, without a high outlay.

The mounting substrate can have external soldering areas suitable for SMT mounting, in particular, and internal plated-through holes, which are generally known, and which will not be discussed in any greater detail at this juncture. Furthermore, the mounting substrate can have openings or windows for receiving external signals such as light, sound, pressure, media or others.

In a further embodiment, still further components can be arranged in the cavity package. They can be, in particular, passive components and active components such as amplifiers/ASICs, which can be connected up among one another and to the MEMS chip.

In a further embodiment, preferably in the case of pressure sensors, the cavity can be hermetically closed off by the covering film being provided with a metallic coating which overlaps it and can extend as far as the MEMS substrate.

In a further embodiment, by way of example, a plurality of microphone chips can be arranged to form an acoustic array in a common package. The rear volumes of the individual chips are preferably acoustically decoupled from one another by the covering film.

In a further possible method step, an additional covering is applied on the active side of the MEMS component after positioning and fixing. However, this method step can also be effected prior to the positioning and fixing of the MEMS component on the mounting substrate.

The MEMS component on the mounting substrate can subsequently be provided with a further package.

In a further embodiment, the covering film applied on the MEMS component can serve as a support for further package parts or coverings. The further package parts can be polymer layers which are applied to the MEMS component by means of molding, potting or lamination. In a further embodiment, the further package parts can also consist of metal. Metallizations without external current or electrolytic layers on a PVD seed layer (physical vapor deposition) are preferably involved in this case. However, it is also possible for the further package parts to consist of a combination of polymer and metal layers.

In a further embodiment, the MEMS component has a metallic layer preferably serving for electromagnetic shielding. In this case, the metallic layer is preferably connected to a ground potential or an external electrical connection.

In a further embodiment of the MEMS component, wherein the active side of the MEMS component faces in the direction of the mounting substrate, the MEMS component is provided with a polymer and/or metal layer, which is constructed directly on the surface predefined by the covering film and the MEMS component. By means of the covering film, a layer construction with further encapsulation elements is thus possible. Moreover, undesired penetration of impurities into the cavity of the MEMS component is thereby prevented. Mounting-dictated spacings, air cushions, etc., are thus avoided. A miniaturized construction and a particularly efficient production are possible as a result.

The metallic layer on the MEMS component can comprise aluminum, copper, nickel, titanium, gold, silver or chromium or alloys or layer sequences composed of these metals. The thickness of the metallic layer is preferably 1-100 µm in this case.

BRIEF DESCRIPTION OF THE DRAWINGS

The subjects described above will be explained in greater detail on the basis of the following figures and exemplary embodiments.

The drawings described below should not be regarded as true to scale. But rather, individual dimensions may be illustrated as enlarged, reduced in size or even distorted for the sake of better illustration. Elements which are identical to one another or which perform the same function are designated by the same reference symbols.

DETAILED DESCRIPTION OF ILLUSTRATIVE EMBODIMENTS

Figure 1:
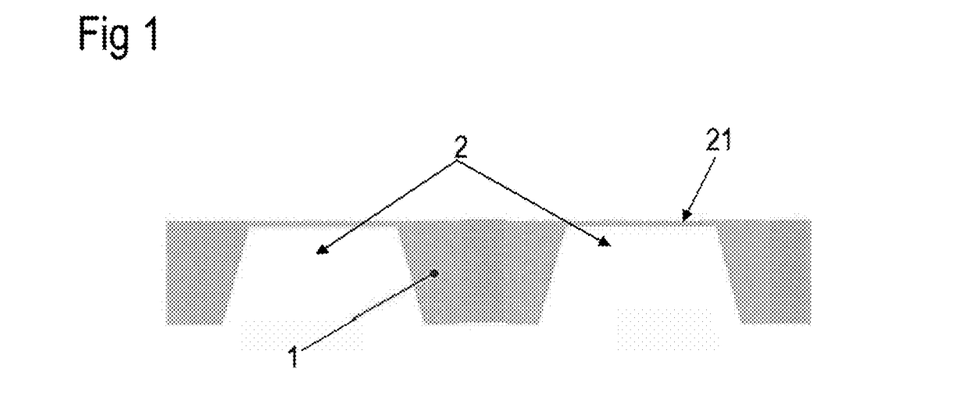
FIG. 1 shows an excerpt from a substrate wafer with a plurality of cavities.

FIG. 1 shows a portion of a wafer serving as substrate 1, in which a plurality of cavities 2 are introduced. The cavities 2 are closed off toward a first side, the active side, with a membrane 21. The cavities 2 are open toward a second side, the inactive side. The cavities 2 are preferably produced by means of an etching method in the substrate 1. However, it is also possible to produce the cavity 2 by means of any other suitable structuring method. The cavities 2 are preferably closed off toward the active side of the substrate 1 with a membrane 21.

During the production of the cavities, the material is preferably removed apart from the membrane 21 in the cavity by means of a wide variety of methods. The membrane 21 can constitute a residual layer thickness of the substrate wafer or can be an additional layer applied on the active side of the MEMS component. In this case, it is possible to stop the structuring step during the production of the cavity 2 selectively at such a layer that is different than the substrate material. The active side of the MEMS component is also distinguished by the fact that there are arranged in the region of this surface or substrate side further functional elements of the MEMS component, preferably also the electrical connection pads for making contact with the component.

Figure 2:
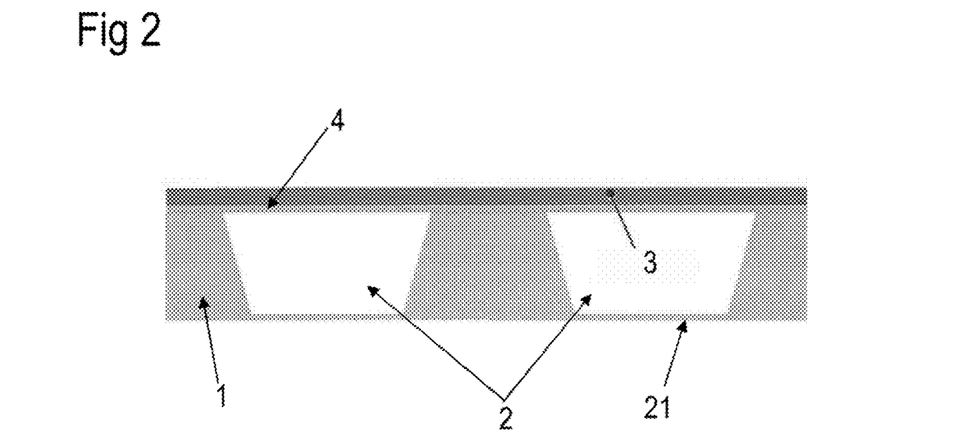
FIG. 2 shows an excerpt from a substrate wafer in which the cavities are covered with a covering.

FIG. 2 shows a wafer of a substrate 1, in which a covering film 3 is applied on the inactive side. The covering film 3 is preferably applied by means of an adhesive layer 4 on the substrate 1, but it can also be inherently adhesive. The covering film 3 covers the wafer of the substrate 1 preferably over the whole area. The adhesive layer 4 between the substrate 1 and the covering film 3 can also be absent in the region of the cavities 2. Preferably, the adhesive layer 4 is arranged at least in the region of the contact area of the substrate 1 and the covering film 3. The covering film 3 is preferably a polymer film. In a further embodiment, a metal film can also be used. In a particularly advantageous embodiment, polyimide films are used. The latter preferably have a thickness of between 20 and 100 µm. The adhesive layer preferably has a thickness of between 10 and 25 µm. The adhesive layer 4 preferably has an adhesive effect which is activated only upon lamination of the covering film 3 on the substrate 1 by means of pressure or heat, for example. In particular, hot melt adhesives or so-called "B-stage" materials are suitable for this purpose.

In an embodiment that is not illustrated, the covering film 3 can also have a form that deviates from the planar, flat spanning of the cavity 2. By virtue of different compliance of the laminating tool, the latter being a roll or pressure plate, for example, the covering film 3 can be made concave, for example, in the region of the cavity 2. Furthermore, it is also possible to set a concave or convex form through the choice of suitable pressure, temperature or time profiles during the lamination of the film onto the wafer. The form is fixed during subsequent full curing of the covering film.

Figure 3:
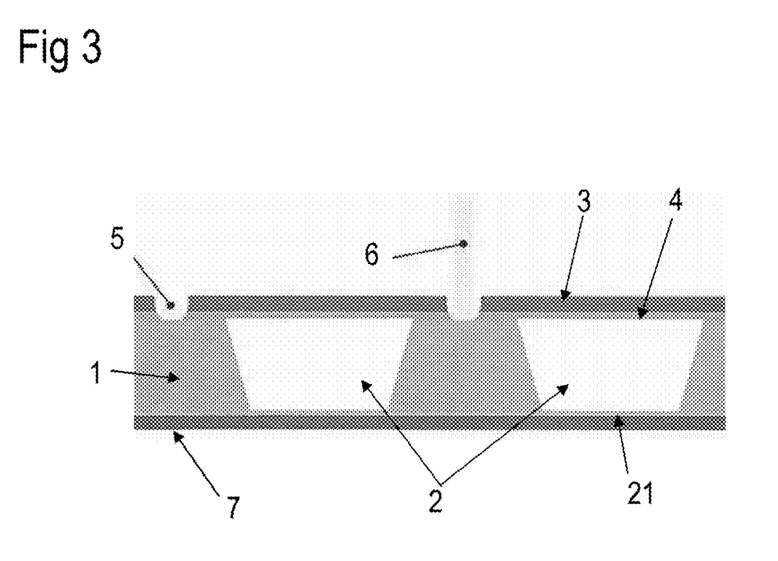
FIG. 3 shows an excerpt from a substrate wafer in which the covering has been removed at specific locations.

FIG. 3 shows a substrate 1 with a plurality of cavities 2. The substrate 1 is applied on a carrier film 7 by the active side. The carrier film 7 preferably serves for protecting the active side of the substrate 1 or for achieving simpler handling of the divided substrate 1 or substrate 1 to be divided. The carrier film 7 preferably involves so-called "UV release tapes". The "UV release tapes" are distinguished by a high adhesive strength, yet the carrier film 7 can easily be stripped away from the substrate 1 again after UV irradiation. In order to singulate the substrate 1 into individual MEMS components, the covering film 3 is provided with separating joints 5 along the lines of a predefined singulation pattern. The separating joints 5 are introduced into the covering film 3 and, if appropriate, into the adhesive layer 4 by means of a laser beam 6, in which case the substrate 1 can remain intact. An attack on the substrate 1 can be avoided through a suitable choice of laser wavelength, focus diameter, power, pulse frequency and scanning parameters.

In a further embodiment (not illustrated), a photolithographically processed covering film 3 can be laminated on the substrate 1, which covering film can be structured by means of scanning or mask exposure and subsequent development in a corresponding manner.

It is also possible to introduce the separating joints 5 into the covering film 3 by means of a sawing method.

Figure 4:
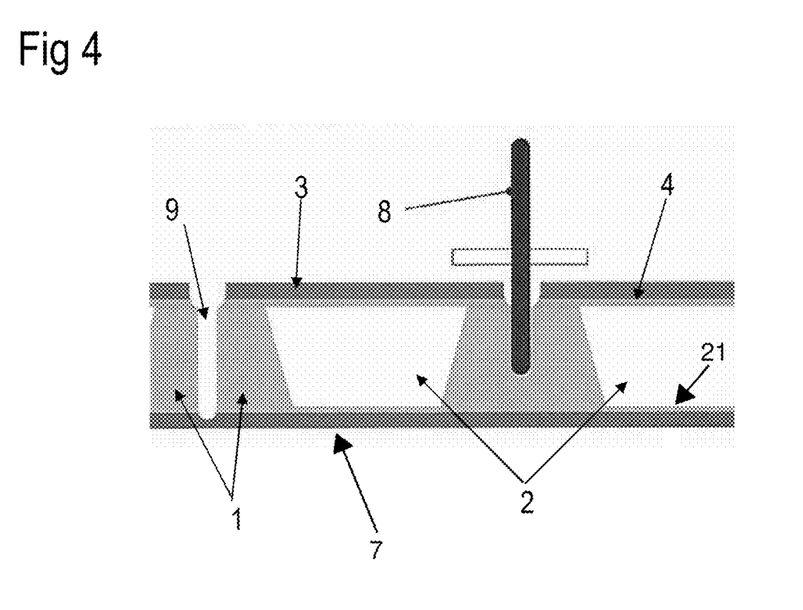
FIG. 4 shows an excerpt from a substrate wafer in which the substrate wafer is divided into individual components by means of a sawing method.

FIG. 4 illustrates a substrate 1 which is divided into individual MEMS components by means of a saw blade 8. Dividing the substrate 1 by means of a saw blade 8 gives rise to cut edges 9. The cut edges 9 preferably extend through the substrate 1. The carrier film 7 remains undamaged for the most part, however, such that the individual MEMS components continue to adhere together on the carrier film 7. For the case where the sawing of the substrate 1 is effected from the inactive side, the previous step illustrated in FIG. 3 can be obviated. The cavity 2 with the sensitive MEMS structures is optimally protected between the covering film 3, firstly, and the carrier film 7, secondly. If permitted by the MEMS structures, it is also possible that sawing can also be effected from the active side of the substrate 1. However, a gentler separating method, rather, is suitable for this purpose.

Figure 5:
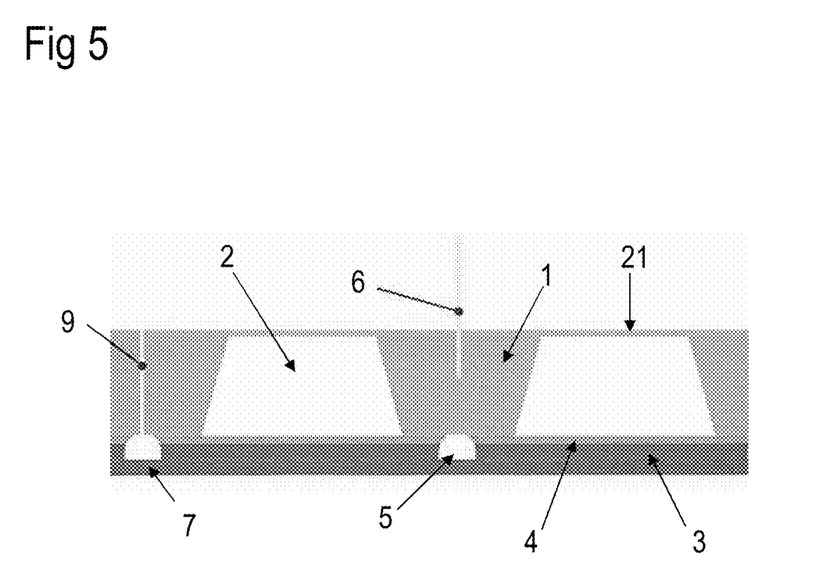
FIG. 5 shows an excerpt from a substrate wafer in which the substrate wafer is divided into individual components by means of laser cutting.

Such a gentler separating method for dividing the substrate 1 into individual MEMS components is illustrated in FIG. 5. In this case, the substrate 1 is cut into individual MEMS components from the active side by means of a laser beam 6. This gives rise to cut edges 9 between the individual MEMS components, as illustrated in FIG. 4. In this embodiment, the substrate 1 is applied to a carrier film 7 by the inactive side, on which the covering film 3 is situated. The MEMS structures on the membrane are sufficiently protected by this gentler method. The introduction of separating joints 5 prior to the division of the substrate 1 can be dispensed with, under certain circumstances, in this method step.

As an alternative, the substrate wafer 1 can also be divided into individual MEMS components by incipient scribing of the surface of the substrate wafer 1 and subsequent controlled breaking or, in a particularly preferred embodiment, by energy input into a focal plane below the surface of the substrate 1. A combination of these two methods is also possible.

Figure 6:
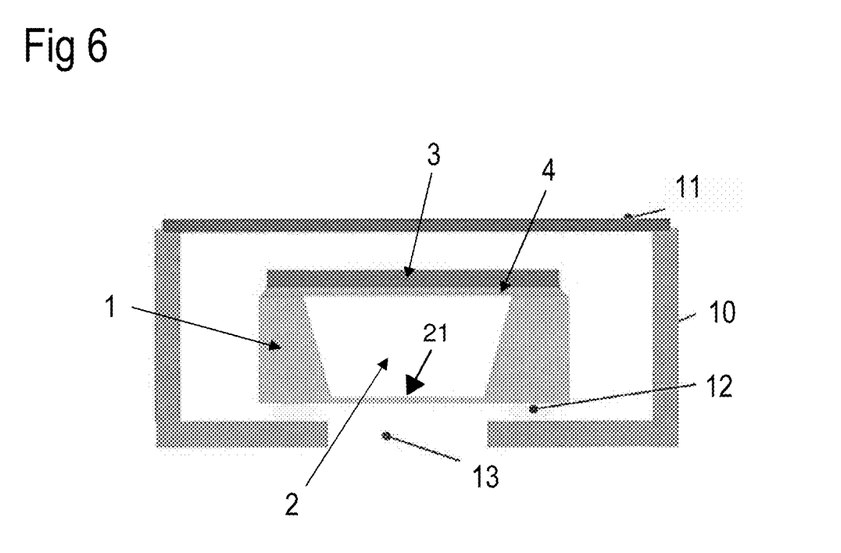
FIG. 6 shows a MEMS component arranged in a cavity package.

FIG. 6 shows an embodiment of the MEMS component in a package, wherein the MEMS component is fixed on the mounting substrate 10 by means of bumps 12. Electrical contact can also be made with the MEMS component via the bumps 12. The cavity package has a covering 11, which forms a closed volume. The closed rear volume formed by the covering film 3 and the MEMS component prevents an undesirably rapid pressure equalization between the front and rear sides of the membrane 21 which could otherwise take place laterally through between the bumps 12 in an unimpeded manner.

The membrane 21 closes off the cavity 2 toward the active side of the substrate 1. The mounting of the MEMS component is preferably effected by means of a vacuum suction tool that can act on the inactive side closed off by the covering film 3. The covering film 3 prevents the membrane 21 of the substrate 1 from being damaged. In the embodiment illustrated, the mounting substrate 10 forms a cavity package. The latter is preferably produced from ceramic, which can be produced with very small dimensions, wall thicknesses around dimensional tolerances without any problems. The cavity package has an opening 13 or window for media, radiation or pressure. The opening 13 is preferably arranged below the MEMS component.

In the cavity package, besides the MEMS component, still further components, not illustrated, in particular passive and amplifiers/ASICs can also be accommodated and connected up among one another and also to the MEMS sensor. In particular, it is also possible to accommodate, for example, a plurality of microphone chips as an acoustic array in a common cavity package, as described above, wherein the rear volumes of the individual microphone chips are decoupled from one another by the covering films 3. Furthermore, contact-connections, external soldering areas in particular for SMT mounting and required plated-through holes can be provided, which are generally known and are therefore not illustrated here.

Figure 7:
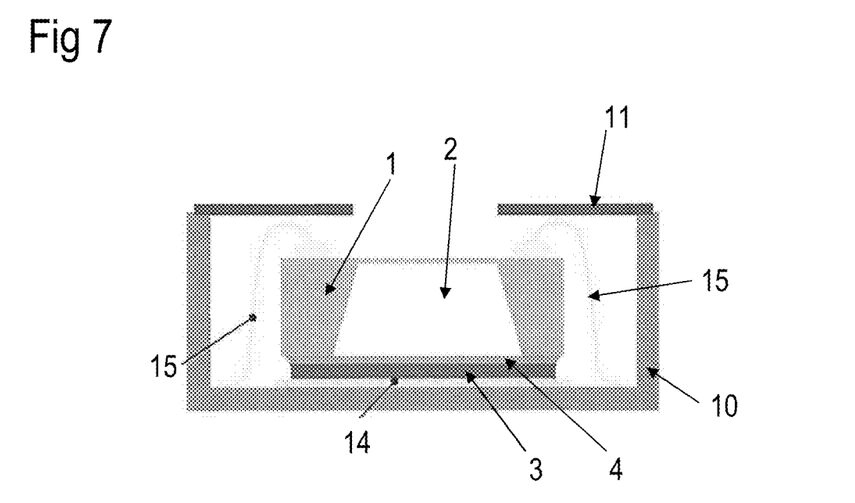
FIG. 7 shows a MEMS component arranged in a further cavity package.

FIG. 7 shows a further embodiment of a positioning of a MEMS component on a mounting substrate 10, or in a cavity package as illustrated in FIG. 7. In this embodiment, the MEMS component is arranged in such a way that the covering film 3, which is applied on the substrate 1 by means of an adhesive layer 4, is directed in the direction of the mounting substrate 10. The covering film 3 thus ensures that the adhesive 14, by means of which the MEMS component is fixed on the mounting substrate 10, does not penetrate into the cavity 2 of the substrate 1. Electrical contact is made with the MEMS component by means of wires 15. So-called wire bonding connections are preferably involved in this case. The package formed by the mounting substrate 10 or on the latter has a covering 11, which has an opening in the embodiment illustrated, which opening can serve, e.g., for the entry of sound.

Figure 8:
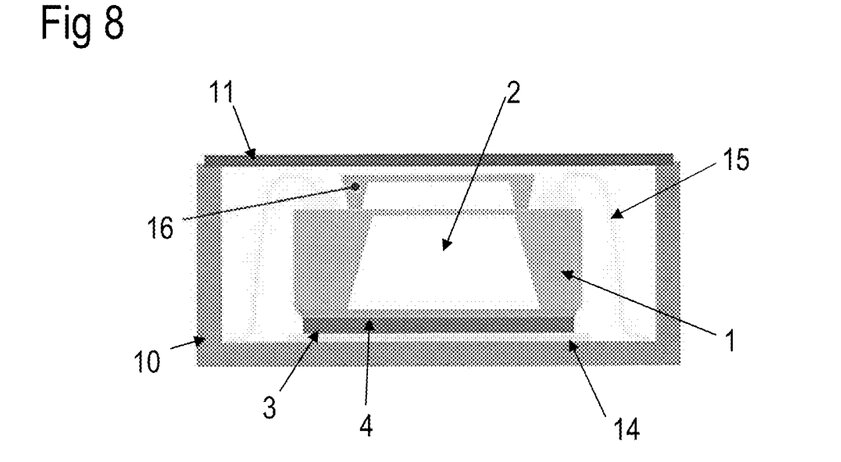
FIG. 8 shows a MEMS component arranged in a cavity package, wherein a further covering is arranged on the active side of the MEMS component.

FIG. 8 illustrates a further embodiment, wherein a MEMS component is arranged on a mounting substrate 10 by the inactive side of the substrate 1. On the active side of the substrate 1, a further covering 16 is arranged in the region above the cavity 2. In this embodiment illustrated, the mounting substrate 10 forms a cavity package, wherein the cavity package is closed off by a covering 11. Contact is made with the MEMS component by means of bonding wires 15. For fixing the MEMS component on the mounting substrate 10, the MEMS component is fixed by the inactive side, on which a covering film 3 is applied by means of an adhesive layer 4, with the aid of a further adhesive layer 14 on the mounting substrate 10. The covering film 3 prevents the adhesive 14 from being able to penetrate into the cavity 2 of the substrate 1. The cavity package can also have openings or windows for media, radiation or pressure, which are not illustrated here.

Figure 9:
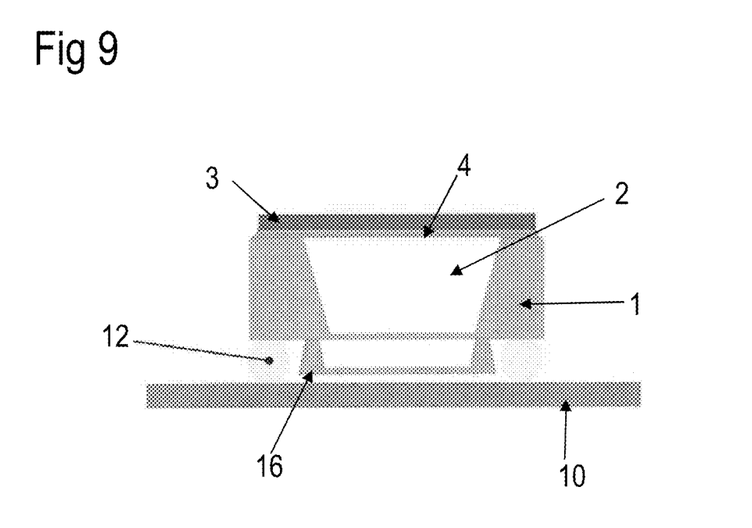
FIG. 9 shows a MEMS component arranged on a mounting substrate.

FIG. 9 shows an embodiment wherein the MEMS component is mounted on a mounting substrate 10 by means of flip-chip technology. Below the active side of the substrate 1, a further covering 16 is arranged in the region of the cavity 2. A covering film 3 is applied on the inactive side of the substrate 1 by means of an adhesive layer 4. The MEMS component is mounted on metallic bumps 12 by means of flip-chip mounting.

Figure 10:
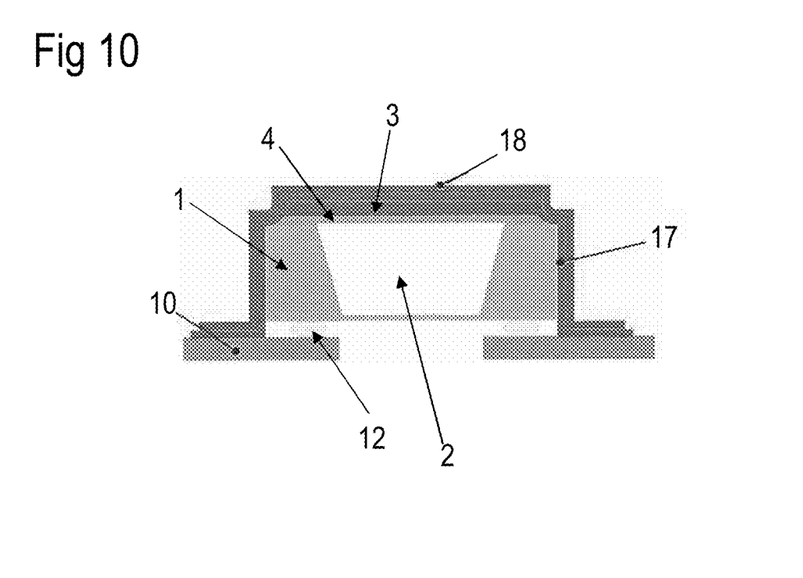
FIG. 10 shows a MEMS component arranged on a mounting substrate, wherein the MEMS component is provided with a further covering.

In FIG. 10, a MEMS component is applied on a mounting substrate 10 by means of bumps 12 via the active side of the substrate 1. The mounting substrate 10 preferably has an opening in the region of the cavity 2 of the substrate 1. The inactive side of the substrate 1 is covered with a covering film 3. The covering film 3 is preferably fixed on the substrate 1 by means of an adhesive layer 4. However, it can also be fused or laminated on the substrate. In this embodiment, the covering film 3 serves as a support for this and further encapsulation elements. In the embodiment illustrated, the covering film 3 spans the cavities in a flat horizontal form. However, it is also possible, by virtue of different compliance of the laminating tool used, such as a rolling or pressure plate, that the covering film 3 is deformed concavely or convexly relative to the surface of the substrate 1 in the region of the cavity 2. It is also possible by means of lamination or after-treatment in an autoclave, through the choice of suitable pressure, temperature or time profiles, to set a concave or else convex form which is fixed after subsequent full curing of the material. A convex or concave form of the covering film 3 makes it possible to enlarge or reduce the volume in the cavity 2.

The MEMS component is provided with a laminate 17 completely spanning the MEMS component, wherein the laminate 17 seals the MEMS component preferably also in the edge region with the mounting substrate 10. In the embodiment illustrated, a metal layer 18 is applied on the laminate 17. A metal layer can also be understood to be a film. The metal layer 18 can comprise aluminum, copper, nickel, titanium, gold, silver or chromium or alloys or layer sequences of the metals. The metal layer 18 is advantageously produced by means of vapor deposition or sputtering, and also by wet-chemical deposition or electrodeposition, or by a combination of these methods. In this case, the metal layer 18 preferably has a thickness of 1-100 µm. The laminate 17 and the metal layer 18 prevent undesired penetration of moisture or particles into the cavity formed by the MEMS component and the mounting substrate 10. Moreover, a shielding against electromagnetic interference is thus formed. Mounting-dictated spacings, air gaps, etc., which are present in the case of an external package can thus be avoided. A miniaturized construction and a particularly efficient production are possible as a result.

By selectively removing the laminate 17 at the edge of the component before applying the metal layer 18, it is possible for the metal layer 18 to be brought into contact with the substrate 1. It is thereby possible, for example, for the metal layer 18 to be linked to the package ground.

Although in the exemplary embodiments only a limited number of possible development of the invention have been able to be described, the invention is not limited thereto. It is possible, in principle, for the covering film to have a concave or convex form.

The invention is not limited to the number of elements illustrated.

The description of the subjects specified here is not limited to the individual specific embodiments; rather, the features of the individual embodiments can be combined with one another as desired insofar as is technically expedient.

What is claimed is:

1. A MEMS component comprising:
   a substrate having an active side and an inactive side arranged opposite the active side;
   at least one cavity disposed in the substrate such that the active side of the substrate closes off a bottom surface and side surfaces of the cavity;
   a covering film overlying the inactive side of the substrate, wherein the covering film is not present in a region adjacent outer edges of the MEMS component such that no covering film touches the inactive side of the substrate in the region the adjacent outer edges of the MEMS component; and
   an adhesive that adheres the covering film on the substrate.

2. The MEMS component as claimed in claim 1, further comprising a membrane, wherein the at least one cavity is closed off on the active side of the substrate by the membrane.

3. The MEMS component as claimed in claim 1, wherein the covering film comprises a polymer film.

4. The MEMS component as claimed in claim 3, wherein the covering film comprises a polyimide film.

5. The MEMS component as claimed in claim 1, wherein the covering film comprises a metal film.

6. The MEMS component as claimed in claim 1, wherein the covering film is deformed concavely relative to a surface of the substrate in a region adjacent the at least one cavity.

7. The MEMS component as claimed in claim 1, wherein the covering film is deformed convexly relative to a surface of the substrate in a region adjacent the at least one cavity.

8. The MEMS component as claimed in claim 1, further comprising a metallization disposed on the covering film, the metallization extending as far as a region of the substrate uncovered by the covering film at the outer edges.

9. The MEMS component as claimed in claim 1, further comprising further components arranged over the covering film.

10. The MEMS component as claimed in claim 1, wherein the MEMS component comprises a pressure sensor.

11. The MEMS component as claimed in claim 1, wherein the MEMS component comprises a microphone.

12. The MEMS component as claimed in claim 1, wherein the MEMS component comprises a bridge-type FBAR.

13. The MEMS component as claimed in claim 1, wherein the covering film has a thickness between 20 and 100 μm.

14. The MEMS component as claimed in claim 1, wherein the adhesive covers the covering film over virtually the entire area of the covering film.

15. A method for producing a MEMS component, the method comprising:
    producing cavities in a substrate wafer, wherein a bottom surface and side surfaces of each cavity is closed off by the substrate wafer toward an active side and each cavity has an opening toward an inactive side; and
    applying a covering film to the inactive side of the substrate wafer, wherein the covering film is adhesively bonded to the substrate wafer at least in a region of the substrate wafer which does not form a cavity; and
    severing the covering film along lines of a singulation pattern as far as the substrate wafer.

16. The method as claimed in claim 15, wherein the covering film is applied over the entire area of the inactive side of the substrate wafer.

17. The method as claimed in claim 15, wherein a membrane remains which closes off the active side of the cavity.

18. The method as claimed in claim 15, wherein applying a covering film comprises applying a polymer film.

19. The method as claimed in claim 18, further comprising adhesively bonding the active side of the substrate wafer onto a carrier film.

20. The method as claimed in claim 15, wherein applying a covering film comprises applying a metal film.

21. The method as claimed in claim 15, wherein severing the covering film comprises performing laser ablation.

22. The method as claimed in claim 15, wherein severing the covering film comprises sawing.

23. The method as claimed in claim 15, further comprising, after severing the covering film, applying a metal layer that covers the covering film and extends as far as the substrate wafer.

24. The method as claimed in claim 15, wherein severing the covering film comprises performing a photolithographic step.

25. The method as claimed in claim 15, further comprising singulating the substrate wafer into individual components using a sawing method.

26. The method as claimed in claim 15, further comprising singulating the substrate wafer by laser cutting.

27. The method as claimed in claim 15, further comprising singulating the substrate wafer by controlled breaking by incipient scribing.

28. The method as claimed in claim 15, further comprising singulating the substrate wafer by means of energy input into a focal plane below a substrate surface.

29. The method component as claimed in claim 15, wherein the adhesive covers the covering film over virtually the entire area of the covering film.

30. A method for handling a MEMS component that comprises a substrate having an active side and an inactive side opposite the active side, at least one cavity disposed in the substrate such that the active side of the substrate closes off a bottom surface and side surfaces of the cavity, a covering film overlying the inactive side of the substrate, and an adhesive that adheres the covering film on the substrate, wherein the covering film is removed in a region adjacent outer edges of the MEMS component, the method comprising:
    gripping the MEMS component; and
    positioning the MEMS component on a mounting substrate,
    wherein the active side of the MEMS component is not in mechanical contact with the mounting substrate at least in the region of the cavity of the MEMS component.

31. The method as claimed in claim 30, wherein gripping of the MEMS component and positioning on the mounting substrate are effected by means of suction.

32. The method as claimed in claim 31, wherein the MEMS component is fixed between its active side and the mounting substrate via an opening in the mounting substrate by means of bumps.

33. The method as claimed in claim 32, wherein the MEMS component is fixed between the mounting substrate and the inactive side of the MEMS component by means of adhesive bonding.

34. The method as claimed in claim 32, further comprising applying an additional covering to the active side of the MEMS component prior to positioning and fixing.

35. The method as claimed in claim 30, wherein the adhesive covers the covering film over virtually the entire area of the covering film.

* * * * *